(12) United States Patent
Fant et al.

(45) Date of Patent: Dec. 2, 2014
(10) Patent No.: US 8,901,996 B2

(54) CONFIGURABLE SYSTEM FOR CANCELLATION OF THE MEAN VALUE OF A MODULATED SIGNAL

(75) Inventors: Andrea Fant, Nimis (IT); Luca Sant, Tarcento (IT); Patrick Vernei Torta, Villach (AT); Lukas Doerrer, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/956,324

(22) Filed: Nov. 30, 2010

(65) Prior Publication Data

US 2012/0133406 A1    May 31, 2012

(51) Int. Cl.
  *H03D 1/06* (2006.01)
  *H04L 25/06* (2006.01)
  *H03D 3/00* (2006.01)

(52) U.S. Cl.
  CPC ......... *H03D 1/06* (2013.01); *H03D 2200/0047* (2013.01); *H03D 2200/005* (2013.01); *H03D 3/003* (2013.01); *H03D 2200/0052* (2013.01)
  USPC ............................. 329/349; 329/367; 375/319

(58) Field of Classification Search
  USPC ........... 329/349–351, 353, 367; 375/317, 319
  See application file for complete search history.

(56) References Cited

U.S. PATENT DOCUMENTS

| | | | |
|---|---|---|---|
| 6,560,447 B2* | 5/2003 | Rahman et al. | 455/232.1 |
| 7,158,063 B2* | 1/2007 | Motz et al. | 341/143 |
| 7,256,384 B2* | 8/2007 | Gottesman et al. | 250/214 C |
| 7,525,464 B2 | 4/2009 | Maloberti et al. | |
| 7,603,094 B2* | 10/2009 | Rahman et al. | 455/241.1 |
| 7,855,668 B2* | 12/2010 | Akizuki et al. | 341/143 |
| 8,174,416 B2 | 5/2012 | Sebastiano et al. | |
| 2011/0026643 A1* | 2/2011 | Ruelke et al. | 375/319 |

FOREIGN PATENT DOCUMENTS

| | | |
|---|---|---|
| CN | 101640539 A | 2/2010 |
| CN | 101765975 A | 6/2010 |
| CN | 101809863 A | 8/2010 |

OTHER PUBLICATIONS

U.S. Appl. No 12/956358, filed Nov. 30, 2010.

* cited by examiner

*Primary Examiner* — Levi Gannon
(74) *Attorney, Agent, or Firm* — Eshweiler & Associates, LLC

(57) ABSTRACT

Some embodiments of the invention relate to a DC offset correction circuit comprising a feedback loop having a DAC controlled by a reconfigurable ADC, which determines (e.g., tracks) the mean value of a modulated input signal. The circuit operates according to two phase process. In a first "pre-modulation" tracking phase, an input signal is tracked by the ADC, which is configured to output the input signal's mean value as a digital code equivalent to the input mean value. The output of the ADC is provided to a DAC, which provides an analog representation of the mean value to an adder that subtracts the mean value from the modulated input signal to generate a bipolar adjusted input signal. In a second "modulation" phase, the estimated mean value is held constant, so that the bipolar adjusted input signal may be provided to an activated modulation circuit for improved system performance.

20 Claims, 8 Drawing Sheets

CONFIGURABLE SYSTEM FOR CANCELLATION OF THE MEAN VALUE OF A MODULATED SIGNAL

REFERENCE TO RELATED APPLICATION

This application relates to U.S. patent application Ser. No. 12/956,358 filed on Nov. 30, 2010.

BACKGROUND

Modulation (i.e., the generation of modulated signals) allows for the transmission of data over transmission medium such as radio waves by impressing data onto a carrier wave by varying the amplitude, frequency, phase, or other characteristics of the carrier wave. Therefore, modulated signals play an important role in wireless communication that is widely used today. For the communication process to be completed the original information is extracted from the modulated carrier wave through a demodulation process.

In various situations a modulated signal may comprise a DC offset in addition to a modulated signal component. For example, sensors configured to detect a physical attribute (e.g., proximity, acceleration, etc.) may comprise a DC offset due to ambient data sources. Similarly, a baseband signal may comprise a DC offset which is introduced by hardware during the course of the baseband signal's transmission across a network.

DRAWINGS

DETAILED DESCRIPTION

Figure 1:
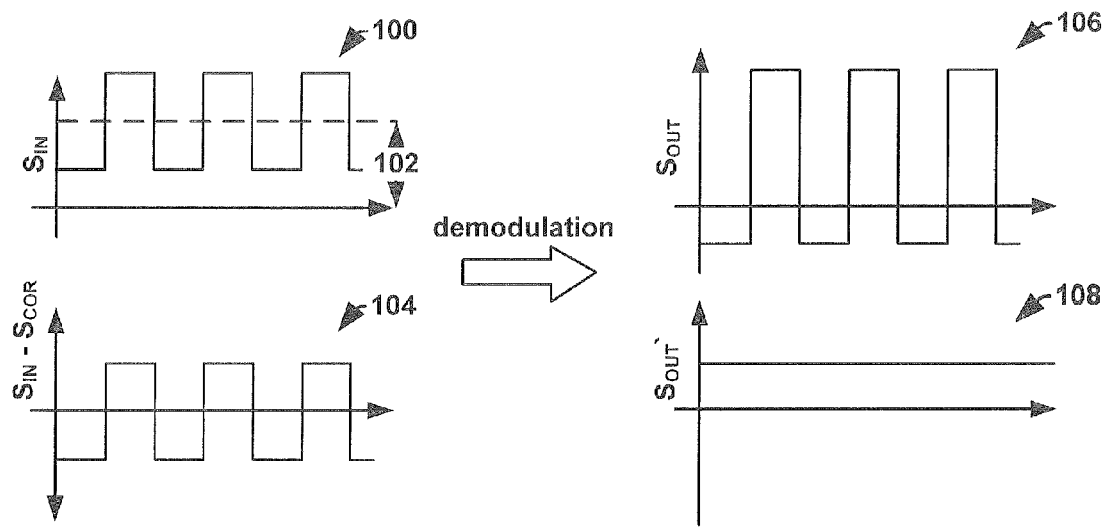
FIG. 1 illustrates graphs showing the modulation of a first signal having a DC offset and a modulated component and a second signal having a modulated component without a DC offset.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

It will be appreciated that as described herein, the term subtraction is intended to encompass both the operation of subtraction of two signals and the addition of a signal with a second signal having an inverted polarity. For example, subtraction of two signals is intended to encompass both the operation of subtracting a first signal (e.g., a DC offset correction signal) from a second signal (e.g., an input signal) and addition of a negative first signal (e.g., a negative DC offset correction signal) and a second signal (e.g., an input signal).

The demodulation of a modulated input signal may also bring about the modulation of DC signal components (e.g., DC offsets) comprised within the modulated input signal, if present. The demodulation of such DC signal components generates unwanted modulated signal components that can lead to a degradation of the system performance (e.g., by folding products or by direct contribution to measurement error). Accordingly, DC signal components of a modulated input signal are therefore typically removed prior to demodulation.

However, the removal of a DC signal component typically requires additional analog or digital blocks that increase complexity, area, and power consumption resulting in circuits having a high complexity and poor area efficiency. For example, the cancellation or extraction of a DC signal component from a modulated input signal can be performed using either analog solutions (e.g., demodulation at known sinusoidal carrier frequency/phase, bandpass filtering of relevant frequency bands) or digital solutions (e.g., filtering of relevant tones or frequency bands after A/D conversion), both of which utilize complex circuitry.

Therefore, the inventors have appreciated that the output of a demodulation circuit will depend on whether or not there is a DC offset component present in a signal input to the modulation circuit. For example, as shown in FIG. 1, the demodulation of an input signal $S_{IN}$ 100 having a DC offset 102 results in an output signal 106 having a modulated signal component (e.g., a signal component having a positive and negative polarity). In contrast, demodulation of an input signal 104 corrected to remove the DC offset $S_{IN}-S_{COR}$ results in an output signal $S_{OUT}'$ 106 having no modulated signal (e.g., a flat signal) at the output of the modulation circuit. Therefore, removing the DC offset from an input signal provided to a demodulation circuit results in an output signal not having modulated components.

Accordingly, a method and apparatus for removing a direct current (DC) offset component from a modulated waveform in power and area efficient way are provided herein. More particularly, as provided herein a DC offset correction circuit is configured to track a mean value of a modulated input signal with one or more circuit components configured within a feedback loop. The mean value is output from the feedback loop to an adder that is configured to subtract the mean value from the modulated input signal, thereby removing the DC offset from the input signal.

In one embodiment, the circuit comprises a feedback loop having a digital-to-analog converter (DAC) controlled by a reconfigurable analog-to-digital converter (ADC), which determines (e.g., tracks) the mean value of a modulated input signal. The circuit operates according to two phase process: a first "pre-modulation" tracking phase and a second "modulation" phase. In the first operating phase, the mean value of an input signal is tracked by the ADC, which is configured to generate an output signal comprising a digital code equivalent to the input signal's mean value. The output signal is provided to the DAC, which generates an analog DC offset correction signal that corresponds to the tracked mean value. The DC offset correction signal is provided to an adder that subtracts the DC offset correction signal from the input signal to generate a bipolar adjusted input signal. Once the DC offset is removed from the input signal, the circuit enters the second operating phase. In the second operating phase, the estimated mean value is held constant so that a bipolar adjusted input signal may be provided to an activated modulation circuit. Since the adjusted input signal is bipolar, performance of the system may be improved through optimization of the system's dynamic range.

Figure 2:
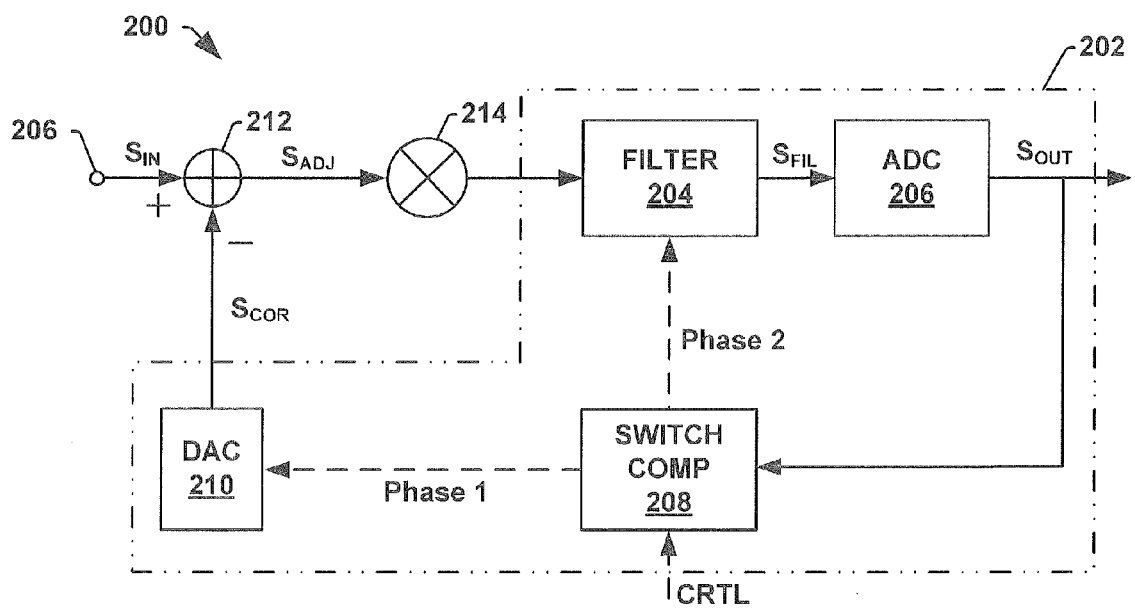
FIG. 2 illustrates a block diagram of a circuit configured to track and correct a DC offset component of a modulated input signal.

FIG. 2 illustrates a block diagram of a circuit 200 configured to track and correct a DC offset component of an input signal $S_{IN}$ having a modulated component and a DC offset component. As shown in FIG. 2, an input signal $S_{IN}$ having a modulated component and a DC offset component is received at an input node 216. As will be more fully appreciated below, the circuit 200 is configured to operate according to a first "pre-modulation" tracking phase and a second "modulation" phase, wherein the second operating phase occurs at a later time than the first operating phase.

In the first operating phase (e.g., when an input signal $S_{IN}$ is initially received) a modulation circuit 214 (e.g., mixer), configured to perform signal modulation and demodulation, is deactivated so that the input signal $S_{IN}$ is provided directly to a feedback loop 202 having one or more circuit components configured to track the DC offset of the input signal $S_{IN}$. The one or more circuit components of the feedback loop determine (e.g., track) the mean value of the input signal $S_{IN}$ and based upon the mean value generate a DC offset correction signal $S_{COR}$ (e.g., a correction voltage, correction current) that is provided to an adder 212. The adder 212 subtracts the DC offset correction signal $S_{COR}$ from the input signal $S_{IN}$ thereby removing the DC offset component from the input signal $S_{IN}$ (e.g., and generating a bipolar modulated signal).

In the second operating phase, once an adjusted input signal $S_{ADJ}$ having substantially no DC offset is generated, the modulation circuit 214 is activated so that the adjusted input signal $S_{ADJ}$ output from the adder 212 (i.e., the bipolar input signal) is delivered directly to the modulation circuit 214. Since the adjusted input signal $S_{ADJ}$ is bipolar, it may improve performance of the modulation circuit 214 and circuit 200 through optimization of the circuit's dynamic range.

In one particular embodiment, shown in FIG. 2, the feedback loop 202 comprises a filter 204, an ADC 206, and a DAC 210. In the first operating phase of such an embodiment, modulation circuit 214 is deactivated so that an input signal $S_{IN}$ received at input node 216, having a modulated component and a DC offset component, is provided directly to an input node of filter 204. The filter 204 is configured to attenuate the input signal $S_{IN}$ resulting in a filter signal $S_{FIL}$ output from an output node of filter 204 that is an approximation of the input signal's mean value. The filter signal $S_{FIL}$ is fed into an input node of a n-bit analog-to-digital converter (ADC) 206 that generates an output signal $S_{OUT}$ comprising a digital code equivalent to the mean value (e.g., mean amplitude) of the input signal $S_{IN}$.

A switching component 208 is configured to selectively couple an output node of the ADC 206 to an input node of DAC 210, so that the output signal $S_{OUT}$ is provided to the DAC 210. It will be appreciated that the term "switching component" as provided herein is not limited to mean a physical switching device. For example, the switching component may comprise any digital means (e.g., a multiplexor) for selectively coupling an output of the ADC 206 to an input of the DAC 210 in the first operating phase and selectively coupling the output of the ADC 206 to the filter 204 in the second operating phase. The DAC 210 is configured to generate an analog DC offset correction signal $S_{COR}$ based upon the digital code of the output signal $S_{OUT}$, wherein the DC offset correction signal $S_{COR}$ is an estimation of the DC offset (e.g., mean value) of the input signal $S_{IN}$. The feedback loop 202 is closed by connecting an output node of the DAC 210 to an adder 212 configured to subtract the DC offset correction signal $S_{COR}$ from the original input signal $S_{IN}$ and thereby generate an adjusted input signal $S_{ADJ}$.

It will be appreciated that the first operating phase may comprise an iterative process that spans multiple feedback cycles. For example, one or more circuit components in feedback loop 202 may generate a correction signal $S_{COR}$ during a first feedback cycle that leaves the adjusted input signal $S_{ADJ}$ with an unacceptable DC offset component (e.g., a DC offset component causing the adjusted input signal to be a unipolar signal). During subsequent feedback cycles the DC offset of the adjusted input signal $S_{ADJ}$ may be further reduced by discretely adjusting the correction signal $S_{COR}$ until the DC offset of the input signal $S_{IN}$ is removed.

In the second operating phase, the modulation circuit (e.g., mixer) 214 is activated to perform demodulation and conversion of the adjusted input signal $S_{ADJ}$. To ensure that the adjusted input signal $S_{ADJ}$ comprises a DC offset that remains corrected, once a DC offset correction signal $S_{COR}$ has been determined that removes the DC offset of the input signal $S_{IN}$, the value of the DC offset correction signal $S_{COR}$ may be held constant to cancel the DC offset of the input signal $S_{IN}$. To hold the DC offset correction signal $S_{COR}$ constant, the switching component 208 decouples the output node of the ADC 206 from the input node of the DAC 210 and instead couples the output node of the ADC 206 to the filter 204. This causes the DC offset correction signal $S_{COR}$ output by the DAC 210, which approximates the input signal mean value, to be held constant while the output signal $S_{OUT}$ from the ADC 206 is used to aid in conversion of the demodulated signal output from the activated modulation circuit 214.

In one embodiment, if the estimated DC offset correction signal $S_{COR}$ is within a predetermined threshold of the actual DC offset (e.g., 0.1 mV) the switching component may receive a control signal that causes it to switch the output of the ADC from the DAC 210 to the filter 204, thereby holding the DC offset correction signal $S_{COR}$ constant.

It will be appreciated that the circuit 200 may track and correct a wide range of mean values. For example, the mean value may comprise a large DC offset value in one embodiment, while in an alternative embodiment the mean value may comprise a small DC offset value. Therefore, the term DC offset, as provided herein, does not denote a particular size of DC offset value but rather is applicable to any DC offset value that may be present in an input signal.

It will also be appreciated that the DC offset correction circuit provided herein allows for reuse of many hardware components by reconfiguration between the first and the second operating phases. For example, the digital output of the ADC is used in the first operating phase to approximately measure the mean value of the input signal may be used in the second operating phase to perform the conversion of the demodulated signal. Therefore, tracking of the DC component can be implemented with minimal additional hardware components, thereby saving area and current consumption.

Figure 3:
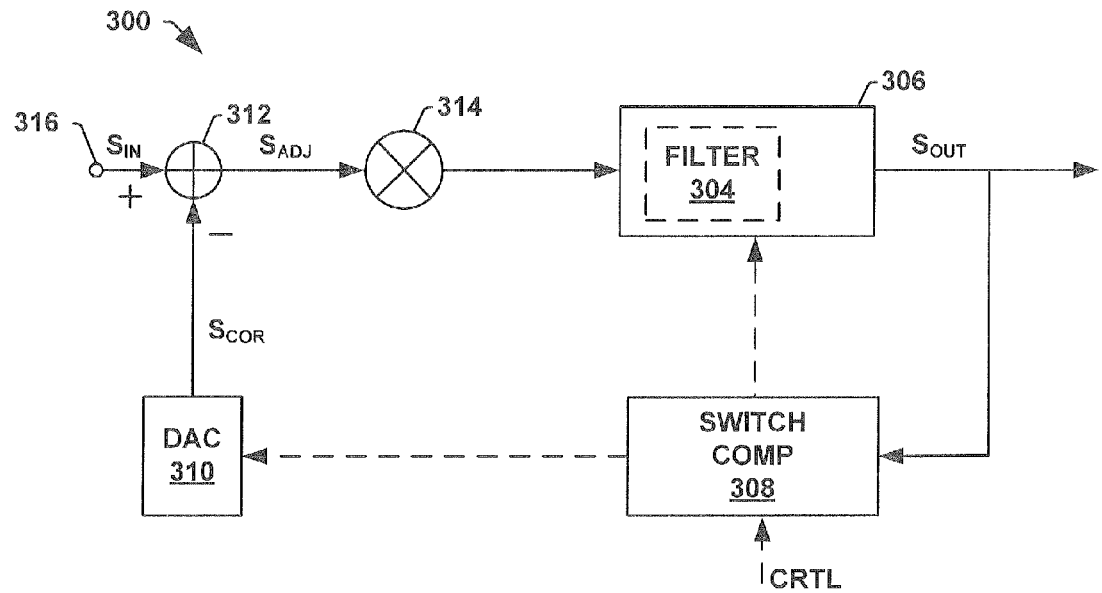
FIG. 3 illustrates an alternative embodiment of a circuit configured to cancel a DC offset of an input signal, wherein the input signal is filtered using an inherent filtering functionality of an ADC.
Figure 4:
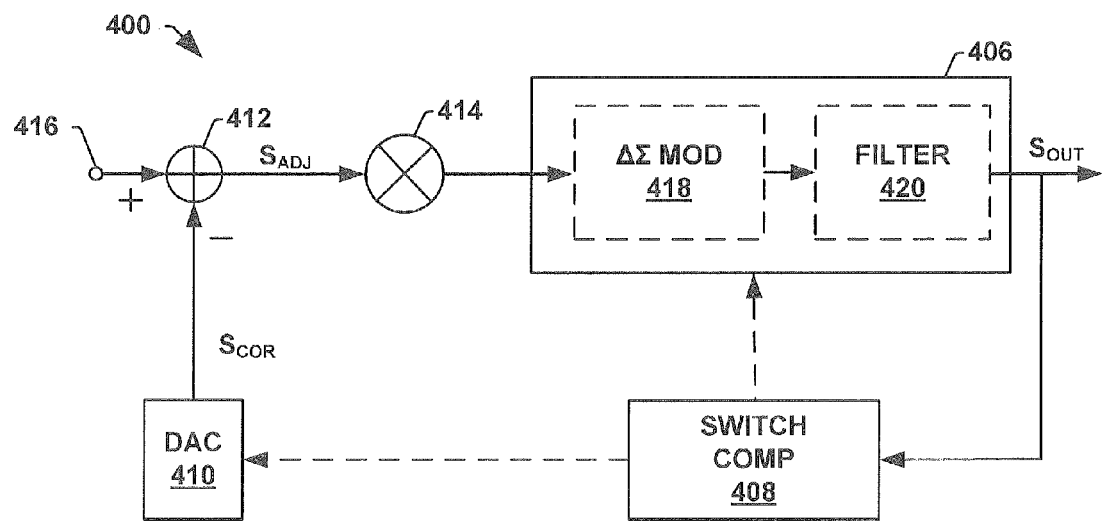
FIG. 4 illustrates an alternative embodiment of a circuit configured to cancel a DC offset of an input signal, wherein the ADC comprises a delta sigma ADC.
Figure 5:
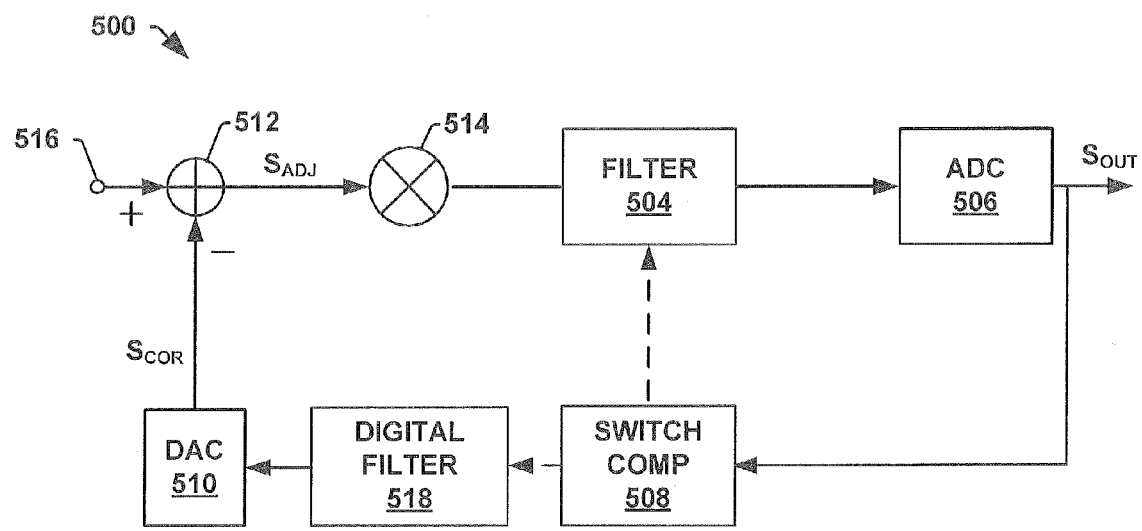
FIG. 5 illustrates another embodiment of a DC offset correction circuit having a feedback loop comprising hardware configured to improve an estimated DC offset resolution.

FIGS. 3-5 illustrate alternative embodiments of a circuit for removing an unwanted DC offset component from an input signal having a modulated component and a DC offset component. It will be appreciated that these embodiments are non-limiting embodiments intended to aid the reader in understanding. A DC offset correction circuit, as provided herein, may incorporate the components of one or more of the circuits illustrated in FIGS. 3-5 or in various embodiments comprise additional components not shown.

FIG. 3 illustrates an alternative embodiment of a circuit 300 configured to cancel a DC offset of an input signal $S_{IN}$, wherein the input signal $S_{IN}$ is filtered using an inherent filtering functionality of the ADC 306 (e.g., a low pass filtering functionality).

In particular, during the first operating phase, the input signal $S_{IN}$ is provided directly to the ADC 306, which performs filtering of the input signal $S_{IN}$, using an inherent filtering component 304 to determine a mean value. The inherent filtering component 304 is configured to attenuate the modulated component of the input signal $S_{IN}$ to result in a mean value estimation of the input signal $S_{IN}$. Based upon the mean value estimation generated by the filtering component, the ADC 306 generates an output signal $S_{OUT}$ comprising digital signals representing the estimated mean value. The output signal $S_{OUT}$ is selectively provided, via switching component 308, to a DAC 310 comprised within a feedback loop. The DAC 310 generates an analog DC offset correction signal $S_{COR}$ based upon the output signal $S_{OUT}$, which is provided to an adder 312 located upstream of the modulation circuit 314.

During the operating second phase, the output signal $S_{OUT}$ from ADC 306 is provided to the ADC 306 to aid in conversion of the demodulated signal. Therefore, the circuit 300 allows for a reduction in the hardware components of the DC offset correction circuit (e.g., in comparison to circuit 200).

FIG. 4 illustrates an alternative embodiment of a circuit 400 configured to cancel a DC offset of an input signal $S_{IN}$, wherein the ADC 406 comprises a delta sigma ADC. In such an embodiment, the delta sigma ADC 406 may comprise a delta signal modulator 418 and a low pass filter 420. The delta sigma modulator 418 is configured to produces an n-bit data stream having an average level that represents the mean value of the input signal $S_{IN}$. The data stream is provided to the low pass filter 420 which is configured to remove noise that is generated during the delta sigma modulation.

During the first operating phase of operation the low pass filter 420 is configured to also generate an output signal $S_{OUT}$ comprising a digital representation of the mean value of the input signal $S_{IN}$. The output signal $S_{OUT}$ is selectively provided, via switching component 408, to a DAC 410 comprised within a feedback loop. The DAC 410 generates an analog DC offset correction signal based upon the output signal $S_{OUT}$, which is provided to an adder 412 located upstream of the modulation circuit 414.

One skilled in the art will appreciate that the delta sigma ADC 406 allows for an improvement in the resolution of estimated mean value over a non delta sigma ADC. In various embodiments, the delta sigma ADC 406 allows for the utilization of oversampling and/or noise shaping techniques to improve resolution of the estimated mean value and therefore of the DC offset correction signal $S_{COR}$. Such improvement in resolution allows for efficient determination of a mean value that generates an adjusted input signal that is bipolar rather than unipolar.

FIG. 5 illustrates a specific embodiment of a DC offset correction circuit 500 having a delta sigma ADC 506 configured to improve resolution of the measured mean value (e.g., of the DC offset correction signal) through use of an additional filter in the feedback loop.

The circuit 500 comprises a delta sigma ADC 506 configured to provide an oversampled output signal $S_{OUT}$ to a feedback loop comprising an additional filter 518. The additional filter reduces the oversampled output signal to a data rate that can be converted by the DAC 510 to a DC offset correction signal $S_{COR}$.

In one embodiment, the additional filter 502 may comprise a decimation filter located within the feedback loop that may be used in conjunction with oversampling by the ADC 506 (e.g., sampling at a sampling rate above the Nyquist criterion) to increase the resolution of the output signal $S_{OUT}$ from n-bits of resolution (e.g., a 5-bit resolution) to n+X bits of resolution (e.g., a 9 bit resolution).

More particularly, ADC 506 may be configured to oversample the input signal $S_{IN}$ to obtain a plurality of samples during a sampling interval. The plurality of samples may be summed and averaged to improve the ADC resolution. The output signal $S_{OUT}$, comprising the plurality of averaged samples, is provided to the decimation filter 502. The decimation filter is configured to extract information from the output signal $S_{OUT}$ by selecting a subset (e.g., one or more) of the plurality of averaged samples, which have a greater resolution than the original sampled value. Extracting information from the outputs signal reduces the data rate to a more useful value without losing any information (e.g., in oversampled signals as many samples can be left out until the signal is not oversampled any more).

For example, a 5-bit ADC may be used to generate a digital signal having 9-bit resolution by oversampling the input signal by at 256 times the target sampling rate. Averaging the 256 consecutive 5-bit samples adds 4 bits to the resolution of the average, producing an output signal $S_{OUT}$ with a 9-bit resolution. The decimation filter may be used to reduce the data rate of the output signal $S_{OUT}$ to a value that can be converted by the DAC 510 to a DC offset correction signal without losing any information.

Therefore the decimation filter improves the resolution of the output signal (and therefore suppression of the mean signal value) by decimating the oversampled output of the digital output filter to provide an output signal having more resolution to the DAC, which allows the DC offset to be determined by a smaller output from the ADC (e.g., the DC offset may be determined by a 5 bit output rather than a 19 bit output).

Therefore, as shown in FIGS. 4 and 5, the DC offset correction circuit provided herein, by tracking the DC offset through measurement of the mean value of the input signal, allows for improvements to be made to the resolution of the DC offset correction signal by the addition of additional circuit components within the feedback loop. Accordingly, the DC offset correction circuit allows for different levels of DC offset suppression to be achieved through selective implementation of hardware components within the feedback loop.

Figure 6A:
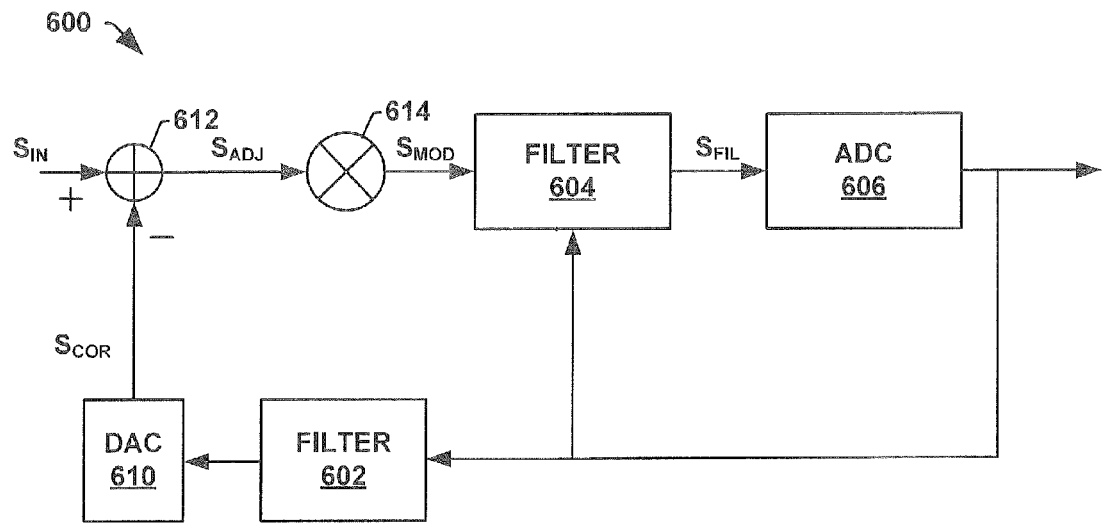
FIGS. 6a-6c illustrate a particular example of the operation of a DC offset correction circuit provided herein, in particular showing signal diagrams of exemplary signals comprised within the DC offset correction circuit.
Figure 6B:
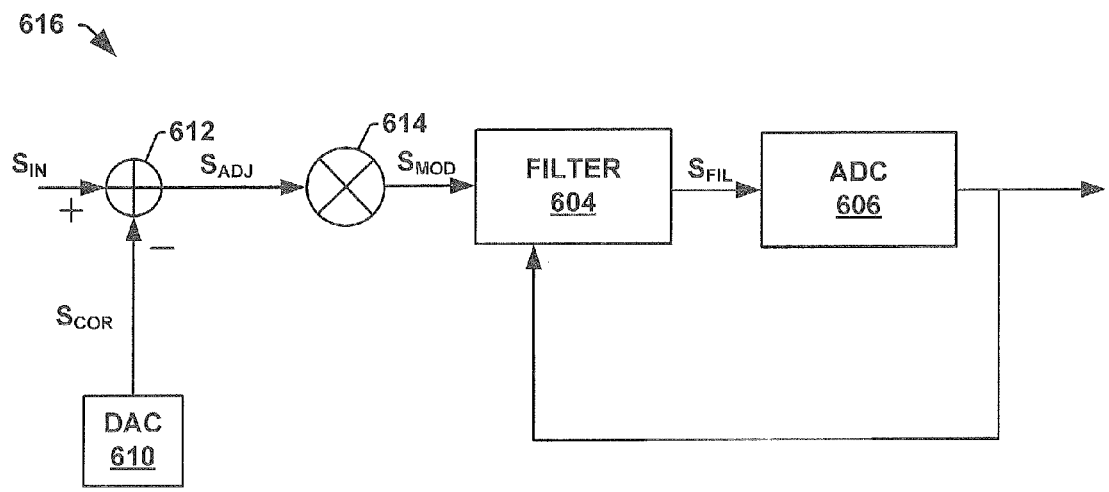
Figure 6C:
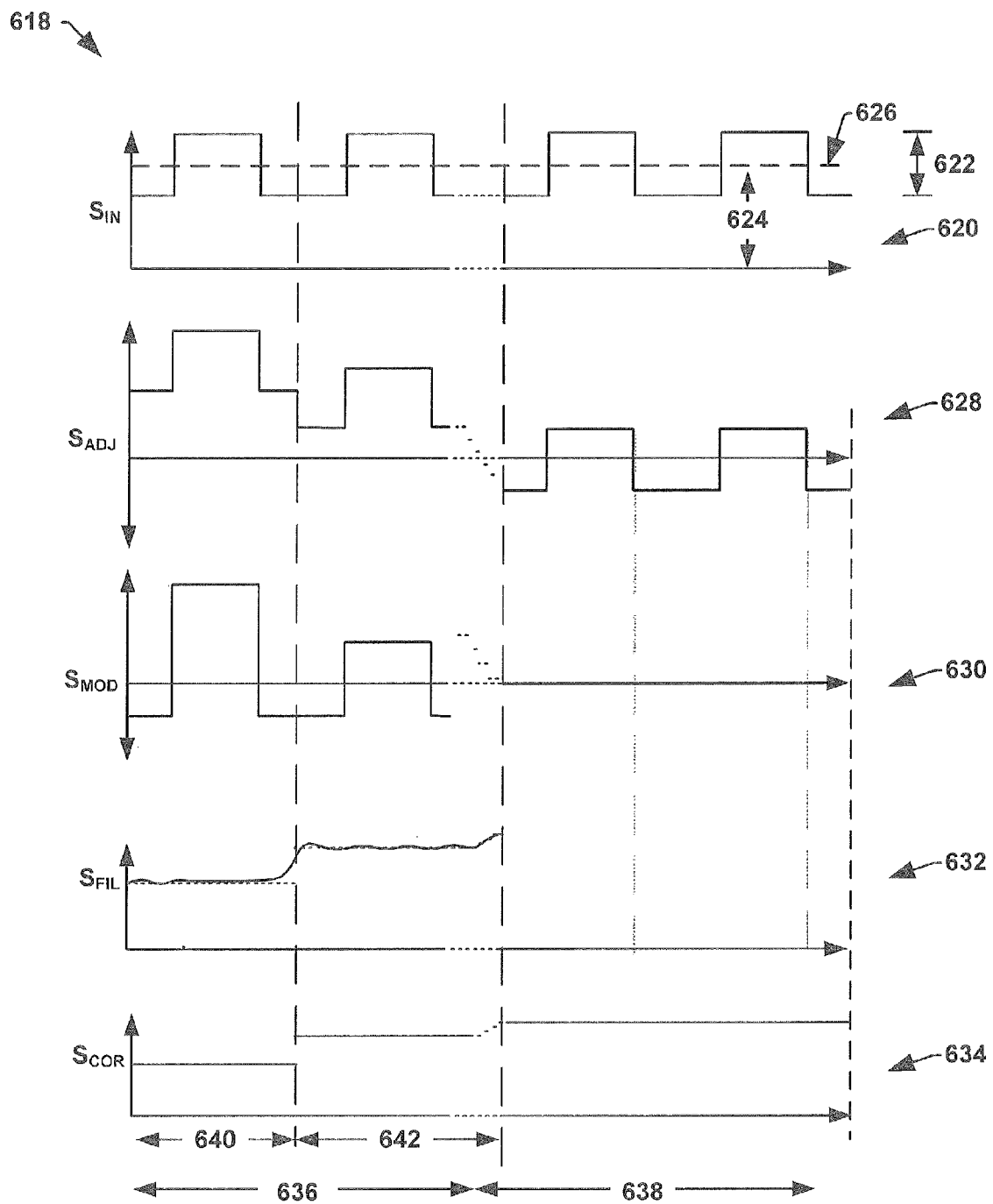

FIGS. 6a-6c illustrate a particular example of the operation of a DC offset correction circuit provided herein. FIGS. 6a and 6b illustrate configurations of a DC offset correction circuit during a first phase (FIG. 6a) and a second phase (FIG. 6b) of operation. FIG. 6c illustrates signal diagrams for the first phase and for the second later phase of operation. It will be appreciated that FIG. 6c is not intended to illustrate temporal aspects of the signal shown. For example, the first operating phase may be accomplished in a time period that may comprise a varying number of modulation cycles and may be shorter than the second operating phase.

As shown in FIG. 6a, in the first operating phase, since the modulation circuit 614 is deactivated, the input signal $S_{IN}$ is provided to a filter 604 via an adder 612. Graph 620 of FIG. 6c illustrates the input signal $S_{IN}$ of the circuit 600 in the first operating phase 636. The input signal $S_{IN}$ comprises a modulated component 622 and a DC offset 624. Graph 628 illustrates the adjusted input signal $S_{ADJ}$ output from the adder 612. If no correction signal $S_{COR}$ is present in the initial feedback cycle of operation, the adjusted input signal $S_{ADJ}$ output from the adder 612 is the same as the input signal $S_{IN}$. Likewise, since the modulation circuit 614 is deactivated the signal output from the modulation circuit $S_{MOD}$ may be the same as the input signal $S_{IN}$ also.

The filter 604 is configured to generate a mean value of the input signal $S_{IN}$ by attenuation of the input signal $S_{IN}$. Graph 612 illustrates a filter signal $S_{FIL}$ output from the filter 604. As shown in graph 612 the filter signal $S_{FIL}$ comprises the mean value of the input signal $S_{IN}$. The filter signal is provided to an ADC 606, which is configured to generate a digital sequence corresponding to the filter signal $S_{FIL}$.

The output of the ADC 606 is connected in a feedback loop to a filter 602 and a DAC 610. The DAC 610 receives the digital sequence and therefrom generates an analog DC offset correction signal $S_{COR}$ illustrated in graph 612. As shown in FIG. 6c, during the first operating phase there is a direct correlation between the filter signal $S_{FIL}$ and the DC offset correction signal $S_{COR}$.

The first operating phase may comprise an iterative process that span multiple feedback cycles 640, 642. For example, the feedback loop may generate a correction signal $S_{COR}$ during a first feedback cycle 640 that leaves the adjusted input signal $S_{ADJ}$ with an unacceptable DC offset (e.g., a DC offset component causing the adjusted input signal to be a unipolar signal). During a subsequent feedback cycle 642 the DC offset may be reduced by discretely adjusting the DC offset correction signal $S_{COR}$ until the DC offset of the input signal $S_{IN}$ is removed.

Once an acceptable DC offset correction signal $S_{COR}$ is determined, the circuit may go onto a second operating phase 638, wherein the DC offset correction signal $S_{COR}$ is held at a constant value and subtracted from the input signal $S_{IN}$ to suppress the mean value of the modulated input signal. As illustrated in FIG. 6b, the output of the ADC 606 is disconnected from the DAC 610 and is instead connected to the filter 604 to perform the conversion of the demodulated signal $S_{MOD}$ generated by the activated modulation circuit 614. This results in a correction signal $S_{COR}$ (graph 634, phase 638) that is independent of the filter signal (graph 632, phase 638), in contrast to the first operating phase, wherein there is a direct correlation between the correction signal $S_{COR}$ (graph 634, phase 636) and the filter signal (graph 632, phase 636).

FIG. 6b also illustrates the output of the active modulation circuit 614. In particular, as shown in FIG. 6c, subtraction of the DC offset correction signal $S_{COR}$ from the input signal $SI_N$ causes the adjusted input signal $S_{ADJ}$ to be a bipolar signal. Modulation of the bipolar adjusted input signal $S_{ADJ}$ provides for a flat modulation signal $S_{MOD}$ since the DC offset components are removed from the input signal.

Therefore, as shown in FIG. 6, the DC offset correction circuit provided herein (e.g., in FIGS. 2-5) performs a delayed optimization of the input signal. This is because the mean value is determined from an input signal in a feedback loop prior to adjust of the input signal and subsequent demodulation and conversion of the input signal.

Figure 7A:
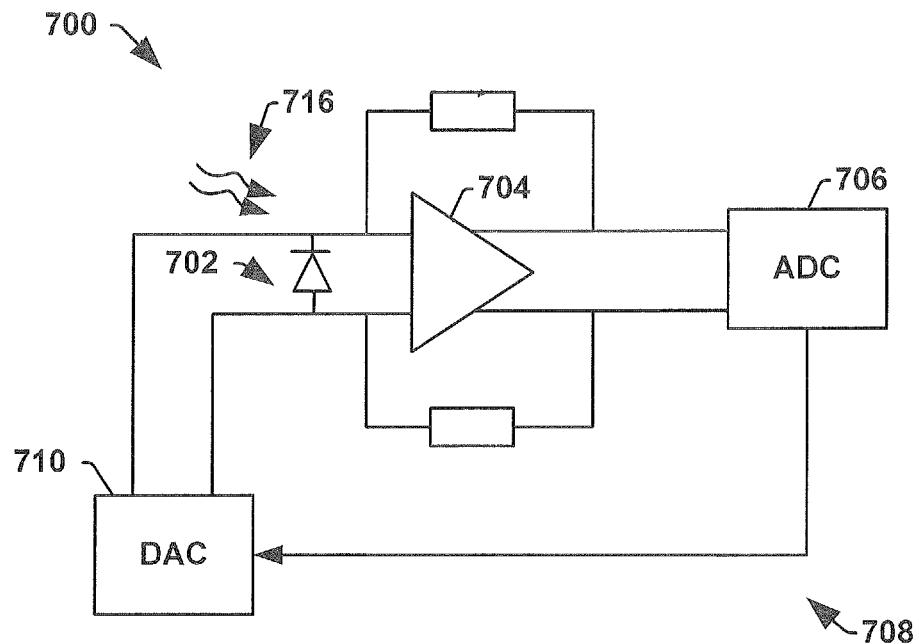
FIGS. 7a-7b illustrates block diagrams of an ambient light and proximity sensor circuit that is configurable to track and correct a DC offset.
Figure 7B:
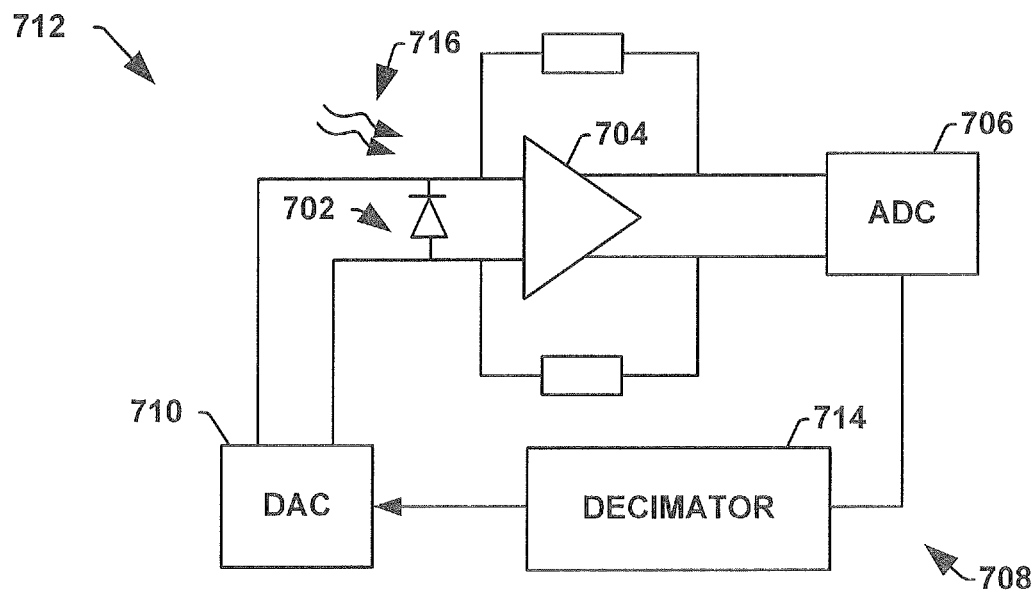

In one embodiment, the circuit provided herein may be circuit will be implemented in an ambient light and proximity sensor chip. FIGS. 7a and 7b illustrate block diagrams of an ambient light and proximity sensor circuit that is configurable to track and correct a DC offset. In such a system the proximity measurement may be achieved by measuring the photocurrent of an infrared photodiode 702 generated by reflection of a sequence of infrared light pulses 716 emitted by an infrared LED (not shown).

It will be appreciated that in addition to receiving infrared light pulses 716, the photodiode 702 will also receive ambient background light. While the infrared light pulses 716 may be converted by the photodiode 702 into a modulated signal, the ambient light pulses will be converted by the photodiode 702 into an unwanted DC offset, thereby resulting in a signal output from the photodiode 702 having a modulated component (e.g., from infrared light pulses) and an unwanted DC offset component (e.g., from ambient background light). Therefore, FIGS. 7a and 7b illustrate a circuit having a two phase operation (e.g., a first pre-modulation tracking phase and a second modulation phase) to remove a DC offset from the output signal of the photodiode 702.

As shown in FIG. 7a, the photodiode 702 is connected differentially to a buffer 704 (e.g., so that the noise from VDD is not injected into the circuit, which may be a problem for very high resolution). An ADC 706 is connected to the output of the buffer 704. The ADC 706 is configured within a feedback loop 708 that connects to a DAC 710 that is configured to cancel DC signal components that are contained within the signal output from the photodiode 702. For example, the DAC 710 may be configured to cancel the DC offset present in the output of the photodiode 702 due to detected ambient light.

If the constant ambient light source (i.e., DC offset) is much larger than the modulated signal provided by the sensor, a high resolution may be used to provide an adequate measurement of the modulated signal over a small absolute amplitude range. Therefore, a system having an ADC that provides a low resolution output for the mean value of the input signal during the first phase of operation may fail to remove the DC offset of the input signal with a sufficient accuracy, thus causing the demodulation of an input signal with mean value other than zero and producing modulated components that could saturate the ADC during the second phase of operation. For example, in one embodiment, an ADC which may comprise a flash ADC having a resolution of 5-bits at the output may be insufficient to measure the mean value with sufficient accuracy.

Therefore, to improve the resolution of the signal output from the ADC 706, a decimation filter 714 may be comprised within the feedback loop 708. The decimation filter 714 allows for the circuit to improve resolution of the mean value of the signal output from the photodiode 702 through the use of oversampling and decimation, as described above in relation to FIG. 5. By improving the resolution through oversampling and decimation the DC offset of the signal output from the photodiode 702 may be measured more accurately so as to reduce the DC offset to a value that is substantially equal to zero.

In one embodiment, the frozen output value of the DAC 710 provided in the second phase of operation may be provided to a user (e.g., via a GUI interface) to evaluate the ambient IR brightness.

Figure 8A:
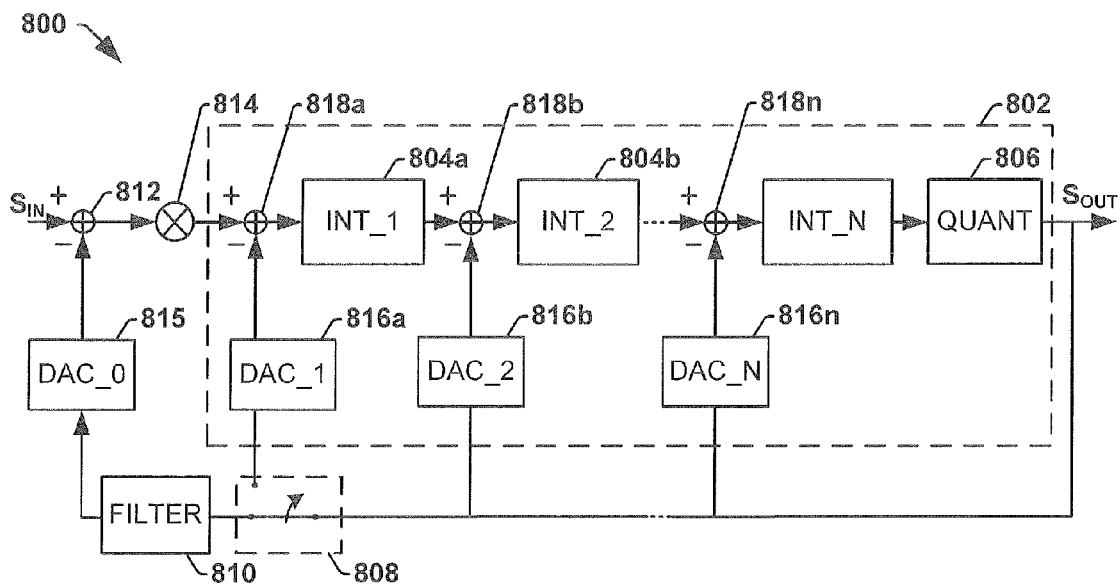
FIGS. 8a-8b illustrates a particular embodiment of a DC offset correction circuit comprising an Nth-order delta sigma ADC constructed from a plurality of integrators.
Figure 8B:
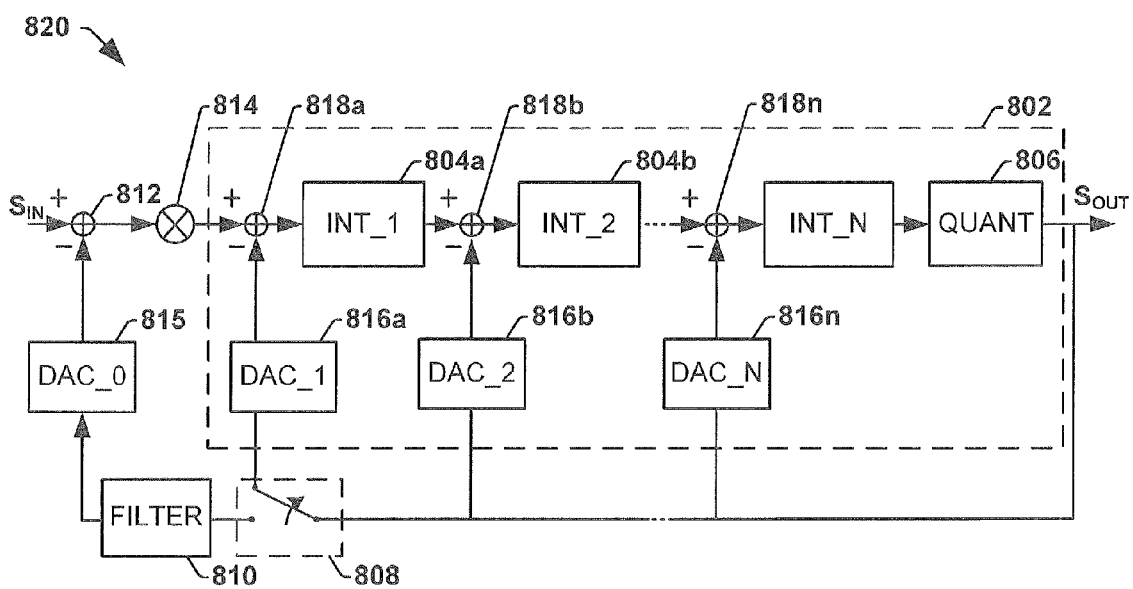

FIGS. 8a and 8b illustrates a particular embodiment of a DC offset correction circuit comprising an Nth-order delta sigma ADC constructed from a plurality of integrators. FIG. 8a illustrates the DC offset correction circuit 800 in a first phase of operation, while FIG. 8b illustrates the DC offset correction circuit 820 in a second phase of operation.

As shown in FIGS. 8a and 8b, the ADC 802 comprises a chain of integrators having a plurality of integrators 804x (where x=a, b, c, . . . n). The chain of integrators is configured to act as a normal low pass filter so that if an input signal $S_{IN}$ is provided at the input of the integrator chain, the plurality of integrators will settle in time to an output signal $S_{OUT}$ comprising the mean value of the input signal $S_{IN}$.

More particularly, ADC 802 comprises an integrator chain having a plurality of integrators 804$x$ connected in series and a plurality of adders 818$x$, respectively configured upstream to each of the integrators 804$x$. The integrators 804$x$ are configured to integrate respective adder outputs in time.

A quantizer 806 is coupled to the output of the last integrator 804$n$ of the integrator chain. The quantizer 806 is configured to receive a signal output from the $n^{th}$ integrator and to digitally convert the signal to a digital sequence comprising information on the mean value of the input signal $S_{IN}$.

A plurality of digital to analog converters 816$x$ are configured to generate analog feedback signals that are subtracted from the respective output signal of a preceding integrator by respective adders. For example, DAC_2 is configured to provide a feedback signal that is subtracted from the output signal of INT_1 by adder 818$b$. An additional digital to analog convert DAC_0 is configured upstream of mixer 814 to provide a correction to the input signal $S_{IN}$ prior to demodulation.

In the first phase of operation (FIG. 8$a$) a switching circuit 808 selects DAC_0 as the output loop of the circuit. An input signal $S_{IN}$ having a DC offset and a modulated part is provided directly to the ADC 802, since mixer 814 is deactivated in the first operating phase.

The ADC 802, comprising a plurality of integrators 804$x$, will track the average value of the input signal $S_{IN}$. In one embodiment, when the integrator chain generates a single bit output signal $S_{OUT}$ having a positive value, the output of the ADC 802 is positive (e.g., "1") and a positive reference voltage is fed back and subtracted from the input signal $S_{IN}$ to move the ADC output in a negative direction. Similarly, when the output of the integrator chain is negative, the ADC output is "0" and a negative reference voltage is fed back and subtracted from the input signal $S_{IN}$. During any observation period, as the input signal $S_{IN}$ becomes more positive, the number of "1"s increases and the number of "0"s decreases. Similarly, as the input signal $S_{IN}$ becomes more negative, the number of "1"s decreases and the number of "0"s increases. Therefore, the feedback signals force the ADC output $S_{OUT}$ to track the average value of the input signal $S_{IN}$, which is provided back through DAC_0 to adder 812, which is configured to subtract the mean value of the input signal, as a DC offset correction signal, from the input signal thereby cancelling the DC offset component of the input signal $S_{IN}$.

In the second operating phase (FIG. 8$b$), the switching circuit 808 selects DAC_1 as the output loop of the circuit and DAC_0 is configured to hold its output (e.g., the estimated DC offset component being provided to adder 812) at a constant value. The mixer 814 is activated to demodulate the adjusted input signal.

Figure 9:
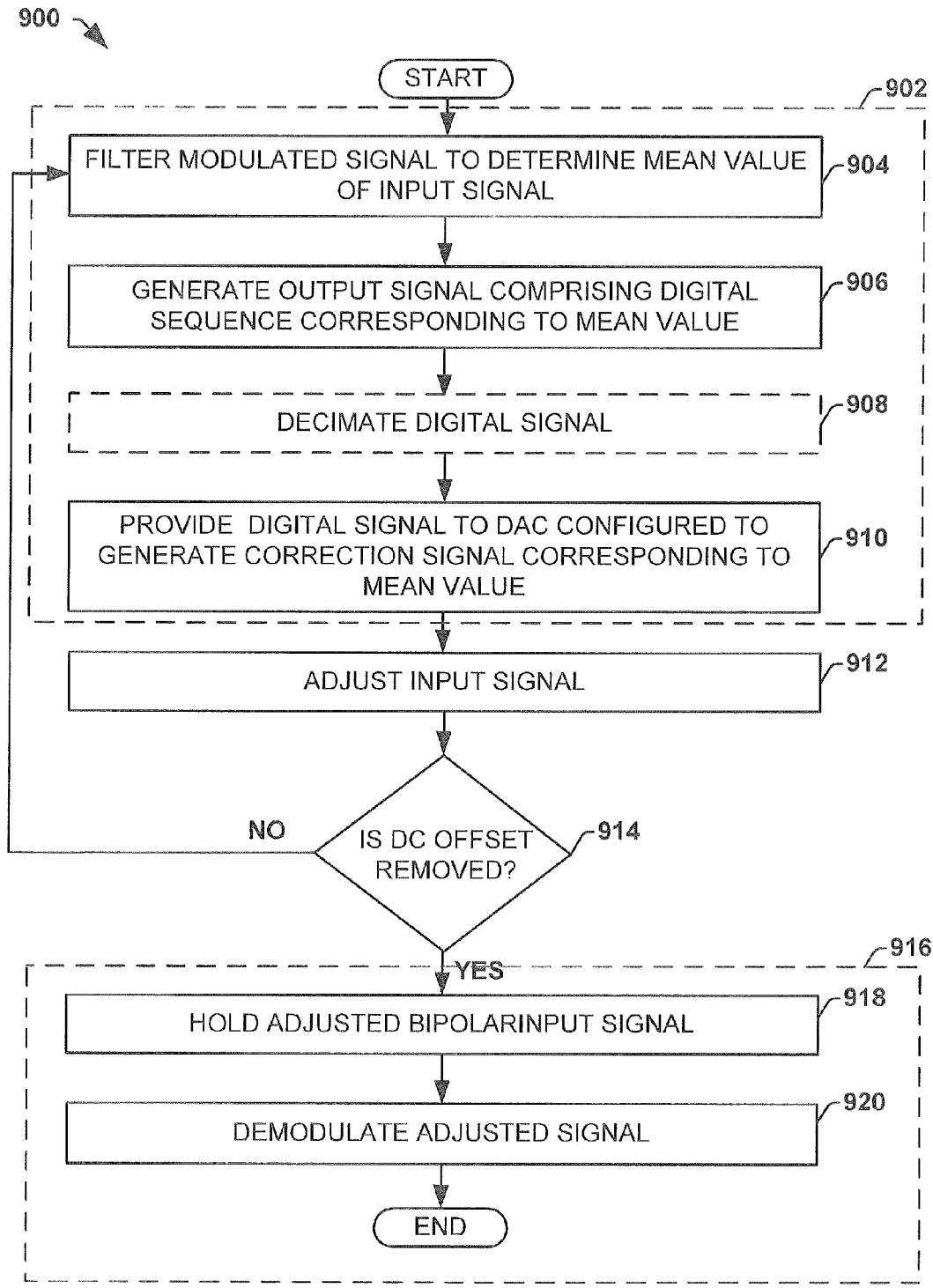
FIG. 9 is a flow diagram of a method for tracking and correcting a DC offset comprised within a modulated signal.

FIG. 9 is a flow diagram of a method 900 for tracking and correcting a DC offset comprised within a modulated signal. In particular, the method comprises tracking a mean value of a modulated input signal using a feedback loop. The mean value is then subtracted from the modulated input signal, thereby removing the DC offset from the input signal While method 900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the circuits shown in FIGS. 2-5, etc., are non-limiting examples of circuits that may be used to implement method 900). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

It will be appreciated that method 900 is performed according to two phases of operation: a first pre-modulation phase 902 and a second modulation phase 916. During the first pre-modulation phase at 902 the DC offset of the input signal is estimated. In one embodiment, estimating the DC offset of the input signal may comprise filtering the modulated input signal to determine a mean value (904), generating a digital signal corresponding to the mean value (906), and generating an analog correction signal based upon the digital signals (908). These steps are described in more detail below.

At 904 an input signal having a modulated component and a DC offset component is filtered to determine a mean value of the input signal. In one embodiment, filtering the input signal attenuates the modulated signal thereby resulting in a filter output signal that is an approximation of the input signals mean value.

At 906 the mean value is converted to a sequence of digital signals. The digital signals may comprise a digital code containing information on the mean amplitude of the input signal in one embodiment.

In one embodiment, wherein oversampling is used to generate a large number of samples in the digital signal, additional filtering may be performed to improve the resolution of the measured DC offset at 908. For example, in one embodiment, the mean value of the input signal may be oversampled and then decimated. Oversampling the input signal so that a number of samples can be used to compute a mean value of the input signal with a greater accuracy than a single sample can provide.

At 910 the digital signal is converted to an analog DC offset correction signal. The DC offset correction signal comprises an estimated DC offset correction based upon the digital code comprising a measured mean value of the input signal.

The DC offset of the input signal is corrected at 912. The DC offset of the input signal is corrected by subtracting the value of the DC offset correction signal from the input signal $S_{IN}$. If the adjusted input signal has an acceptable DC offset component (e.g., a DC offset component causing the adjusted input signal to be a bipolar signal that fits within the conversion capabilities of the ADC during the second phase) the method processes to a second phase at 916. If the adjusted input signal does not have an acceptable DC offset component (e.g., a DC offset component causing the adjusted input signal to be still a unipolar signal or to saturate at any point the input of the ADC during the second phase) the method returns to the first phase at 902.

During a second modulation phase at 916 the DC offset correction signal is held constant and the adjusted input signal is demodulated.

At 918 the DC offset correction signal is held at a constant value to produce an adjusted input signal that consistently comprises a bipolar input signal.

The adjusted input signal is demodulated at 920. As stated above, the adjusted input signal improves performance of a system through optimization of the system's dynamic range.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A circuit, comprising:
    an input node configured to receive an input signal having a modulated component and a DC offset component;
    a modulation circuit configured to perform signal modulation and demodulation;
    a feedback loop comprising one or more circuit components configured to track a mean value of the input signal and to generate a DC offset correction signal from the mean value; and
    an adder coupled to the input node, an output of the feedback loop, and the input of the modulation circuit, wherein the adder is configured to subtract the DC offset correction signal from the input signal to generate a bipolar adjusted input signal,
    wherein the modulation circuit is selectively deactivated during a first operating phase so that the input signal is provided to the feedback loop and selectively activated during a second operating phase so that the bipolar adjusted input signal output from the adder is delivered to the modulation circuit before being provided to the feedback loop.

2. The circuit of claim 1, wherein the feedback loop comprises:
    a filter configured to attenuate the input signal to determine the mean value of the input signal;
    an analog-to-digital converter (ADC) coupled to the filter and configured to generate an output signal comprising a sequence of digital signals corresponding to the determined mean value; and
    a digital to analog converter (DAC) configured to receive the output signal and to generate an analog DC offset correction signal from the determined mean value.

3. The circuit of claim 2, wherein the filter comprises an inherent filter representing the analog-to-digital converter.

4. The circuit of claim 2,
    wherein, during the first operating phase, the modulation circuit is configured to allow the input signal to be provided to the feedback loop, wherein the digital to analog converter (DAC) is configured to generate the DC offset correction signal from the input signal and to provide it to the adder;
    wherein during the second operating phase:
    the DC offset correction signal, output from the DAC, is held at a constant value by the DAC;
    the modulation circuit is activated such that the bipolar adjusted input signal is provided to the modulation circuit which is configured to generate a demodulated signal; the output of the ADC is provided by a switching component to the filter to aid in conversion of the demodulated signal.

5. The circuit of claim 2, wherein the ADC comprises a delta sigma analog-to-digital converter.

6. The circuit of claim 2, further comprising:
    an additional filter configured between an output of the ADC and an input of the DAC,
    wherein the ADC is configured to generate a plurality of samples by oversampling the input signal, to sum and average the plurality of samples, and to provide the plurality of averaged samples as the output signal;
    and wherein the additional filter is configured to select a subset of the plurality of averaged samples for the DAC.

7. The circuit of claim 6, wherein the additional filter comprises a decimation filter.

8. The circuit of claim 2, wherein the circuit is configured to correct the DC offset of the input signal through a plurality of iterations that discretely adjust the DC offset correction signal until the DC offset is substantially removed.

9. The circuit of claim 2, wherein the ADC comprises:
    an integrator chain having a plurality of integrators connected in series;
    a plurality of adders respectively configured upstream to each of the integrators;
    a quantizer coupled to the output of a last integrator of the integrator chain, wherein the quantizer is configured to receive a signal output from the last integrator and to digitally convert the signal to a digital sequence comprising information on the mean value of the input signal; and
    a plurality of digital to analog converters configured to generate analog feedback signals that are subtracted from respective output signals of a preceding integrator by respective plurality of adders.

10. The circuit of claim 2, wherein the circuit comprises an ambient light and proximity sensor circuit, and wherein the input signal comprises a photocurrent of an infrared photodiode, and wherein the DC offset component is generated by ambient light received by the photodiode.

11. A circuit, comprising:
    an analog-to-digital converter (ADC) configured to receive an input signal having a modulated component and a DC offset component, to measure a mean value of the input signal, and to generate one or more digital signals corresponding to the measured mean value;
    a digital-to-analog converter (DAC) disposed in a feedback loop and configured to receive the one or more digital signals and to generate a DC offset correction signal from the one or more digital signals, which is an analog representation of the mean value of the input signal;
    an adder configured to receive the DC offset correction signal and to subtract the DC offset correction signal from the received input signal prior to demodulation to generate an adjusted input signal; and a switching component configured to selectively couple an output of the ADC to an input of the DAC during a first operating phase and to selectively decouple the output of the ADC from the input of the DAC during a second operating phase.

12. The circuit of claim 11, wherein the ADC comprises a filter to measure the mean value of the input signal.

13. The circuit of claim 12, further comprising:
a modulation circuit coupled to an output of the adder, wherein the modulation circuit is selectively deactivated during the first operating phase and selectively activated during the second operating phase;
wherein during the first operating phase the modulation circuit is configured to allow the input signal to be provided to the feedback loop, wherein the DAC is configured to generate the DC offset correction signal from the input signal and to provide it to the adder;
wherein during the second operating phase:
the DC offset correction signal, output from the DAC, is held at a constant value by the DAC;
the modulation circuit is activated such that the adjusted input signal is provided to the modulation circuit which is configured to generate a demodulated signal; and
the output of the ADC is provided by the switching component to the filter to aid in conversion of the demodulated signal.

14. The circuit of claim 12,
wherein the switching component is further configured to selectively couple the output of the ADC to the filter in the second operating phase.

15. The circuit of claim 11, further comprising a decimation filter coupled between the ADC and the DAC,
wherein the ADC is configured to generate a plurality of samples by oversampling the input signal, to sum and average the plurality of samples, and to provide the plurality of averaged samples as the one or more digital signals;

and wherein the decimation filter is configured to select a subset of the plurality of averaged samples for the DAC.

16. A method for removing a DC offset component from a modulated signal, comprising:
filtering an input signal having a modulated component and a DC offset component to determine a mean value of the input signal during a first operating phase;
generating an output signal comprising a sequence of digital signals corresponding to the determined mean value;
generating a DC offset correction signal from the output signal, wherein the DC offset correction signal is an analog representation of the determined mean value of the input signal;
subtracting the DC offset correction signal from the input signal to form an adjusted input signal having substantially no DC offset component; and
holding the DC offset correction signal constant while demodulating the adjusted input signal during a second operating phase subsequent to the first operating phase.

17. The method of claim 16, further comprising:
oversampling the input signal to generate a plurality of samples;
summing and averaging the plurality of samples;
providing the plurality of averaged samples as the output signal;
decimating the output signal comprising the plurality of averaged samples to select a subset of the plurality of averaged samples; and
generating the DC offset correction signal from the decimated output signal.

18. The method of claim 16, further comprising:
iteratively correcting the DC offset of the input signal through discretely adjusting the DC offset correction signal.

19. The method of claim 16, wherein the input signal is not modulated during the first operating phase.

20. The method of claim 16, further comprising:
using the output signal to aid in demodulation of the adjusted input signal during the second operating phase.

* * * * *